(12) United States Patent
Pernyeszi (10) Patent No.: US 9,570,547 B2
(45) Date of Patent: Feb. 14, 2017

(54) MONOLITHIC DMOS TRANSISTOR IN JUNCTION ISOLATED PROCESS

(71) Applicant: Joseph Pernyeszi, Scotts Valley, CA (US)

(72) Inventor: Joseph Pernyeszi, Scotts Valley, CA (US)

(73) Assignee: General Electronics Applications, Inc., Scotts Valley, CA (US)

( * ) Notice: Subject to any disclaimer, the term of this patent is extended or adjusted under 35 U.S.C. 154(b) by 0 days.

(21) Appl. No.: 14/959,286

(22) Filed: Dec. 4, 2015

(65) Prior Publication Data

US 2016/0163791 A1    Jun. 9, 2016

Related U.S. Application Data

(60) Provisional application No. 62/089,687, filed on Dec. 9, 2014.

(51) Int. Cl.
| | | |
|---|---|---|
| *H01L 29/94* | (2006.01) | |
| *H01L 29/06* | (2006.01) | |
| *H01L 29/78* | (2006.01) | |
| *H01L 29/08* | (2006.01) | |
| H01L 29/10 | (2006.01) | |
| H01L 21/762 | (2006.01) | |

(52) U.S. Cl.
CPC ....... *H01L 29/0634* (2013.01); *H01L 29/0692* (2013.01); *H01L 29/0886* (2013.01); *H01L 29/7816* (2013.01); H01L 21/76237 (2013.01); H01L 29/1095 (2013.01)

(58) Field of Classification Search
CPC ............. H01L 29/0653; H01L 29/0634; H01L 29/0692; H01L 29/0886; H01L 29/1095; H01L 29/7816
USPC .......................................................... 257/339
See application file for complete search history.

(56) References Cited

U.S. PATENT DOCUMENTS

| | | | |
|---|---|---|---|
| 4,811,075 A | 3/1989 | Eklund | |
| 5,155,568 A | 10/1992 | Pernyeszi | |
| 6,236,100 B1 | 5/2001 | Pernyeszi | |
| 6,573,550 B2 | 6/2003 | Pernyeszi | |
| 6,900,101 B2 * | 5/2005 | Lin | H01L 29/7816 257/E21.345 |
| 6,992,362 B2 | 1/2006 | Pernyeszi | |
| 7,288,816 B2 * | 10/2007 | Kanda | H01L 21/761 257/335 |

(Continued)

*Primary Examiner* — Luan C Thai
(74) *Attorney, Agent, or Firm* — Davis Wright Tremaine LLP (57) ABSTRACT

A high voltage DMOS half-bridge output for various DC to DC converters on a monolithic, junction isolated wafer is presented. A high-side lateral DMOS transistor is based on the epi extension diffusion and a five layer RESURF structure. The five layers are made possible by the epi extension diffusion which is formed by a suitable n-type dopant diffused into a p-type substrate and it is the same polarity as the epi. The five layers, starting with the p-type substrate, are the substrate, the n-type epi extension diffusion, a p-type buried layer, the n-type epi and a shallow p-type layer at the top of the epi. The epi extension is also used to shape the electric field by a specific lateral distribution and make the lateral and vertical electric fields to be the smoothest to avoid electric field induced breakdown in the silicon or oxide layers above the silicon.

11 Claims, 9 Drawing Sheets

(56) References Cited

U.S. PATENT DOCUMENTS

| | | | |
|---|---|---|---|
| 7,514,754 B2 * | 4/2009 | Ma | H01L 21/82389 |
| | | | 257/337 |
| 8,324,684 B1 | 12/2012 | Pernyeszi | |
| 2009/0014791 A1 * | 1/2009 | Anderson | H01L 21/84 |
| | | | 257/337 |

* cited by examiner

MONOLITHIC DMOS TRANSISTOR IN JUNCTION ISOLATED PROCESS

CROSS-REFERENCE TO RELATED APPLICATION

This application claims priority from U.S. Provisional Applications No. 62/089,687, filed on Dec. 9, 2014, which is hereby incorporated in its entirety by this reference.

BACKGROUND

This application relates to high voltage DMOS devices.

Circuit applications often require high voltage and low voltage components on a monolithic integrated circuit. Often multiple high voltage devices are needed. Such circuits have greatly proliferated into various applications as they make possible energy efficient solutions to lighting, motor drivers and power supplies. A half bridge is formed by a low side and a high side transistor. Due to many advantages, in such applications either DMOS (double-diffused metal-oxide-semiconductor) or, for higher current, IGBT (insulated-gate bipolar transistor) devices are used. There are advantages to having a high side DMOS to form the half bridge configuration. Low side DMOS transistors have been produced in monolithic, junction isolated processes for some time, but high side DMOS transistors have only been produced in the same with very limited breakdown voltage. In many applications designers use a low voltage control circuit and discrete DMOS transistors to build a complete circuit.

Building a high side DMOS is more complicated than building a low side DMOS because the p-body and the source will be at high voltage when the transistor is turned on. In traditional monolithic processes, the epi (epitaxy) is too thin to support high voltage between the source/body layers and the substrate. N-channel DMOS use a p-type body diffusion and it will punch through to the p-type substrate at relatively low voltage. It is possible to build the device on a much thicker epi; however, the low voltage part of the circuit needs an isolation diffusion that penetrates the epi at least half way or more. And a p-type buried layer needs to be used that penetrates the epi at least half way to meet with the isolation diffusion. This is the up-down isolation scheme to minimize the lateral diffusion. Making deep isolation diffusions is possible, but at the expense of having a wide isolation diffusion due to the lateral diffusion of the dopant (such as boron) taking up a large area on the chip.

The usual architecture of these types of circuits is such that they use only a few high voltage transistors and many low voltage transistors, the low voltage transistors forming a complex control circuit. The low voltage components are small but require isolation between them. As such, the deep, and necessarily wide, isolation diffusion can easily double the area of a low voltage device, making it impossible to build an economical monolithic integrated circuit with a thick epi. The cost of a monolithic integrated circuit is proportional to the complexity of the manufacturing process to make it and to the area of the chip. Workers in the field have expanded a major effort to reduce the size of the chip while maintaining its level of performance. The area factor is important in high voltage devices as the depletion layer spreads much more with increasing voltage. Various techniques were introduced to minimize the area the depletion layer needs, such as the introduction of the epi extension diffusion, selective epi growth and refill, or the RESURF (re-entrant surface field) principle. These techniques vary in usefulness in building monolithic integrated circuits where a mixture of low voltage and high voltage components are needed.

In typical prior art arrangements, high voltage half bridge circuits use discrete transistors. Monolithic circuits are limited to about 100V. High voltage DMOS transistors have been made using SOI (silicon on insulator) technology. Due to the complete oxide isolation, the transistors can be used as high side devices and low side devices. Some examples of DMOS device are given in U.S. Pat. Nos. 4,811,075; 5,155,568; 6,236,100; 6,573,550; 6,992,362; and 8,324,684.

SUMMARY

The following presents a device whose drain is connected to the positive power supply and its source can swing from ground (the negative terminal of the power supply) to the positive power supply under control from its gate terminal.

A first set of exemplary embodiments for a lateral DMOS transistor includes a substrate and first and second isolation regions formed above the substrate. A source is region formed above the substrate between the first and second isolation regions, and a drain region is formed above the substrate between the first isolation region and the source region. A gate structure is formed over the substrate between the source region and the drain region and adjacent to the source region. A first epitaxy layer is formed over the substrate between the isolation regions and a buried layer is formed above the first epitaxy layer and extending laterally between, but not under, the source region and the drain region. A second epitaxy layer is formed over the first epitaxy layer and the first buried layer between the isolation regions and a first surface layer is formed over the second epitaxy layer between the gate structure and the drain region. The substrate, first epitaxy layer, first buried layer, second epitaxy layer, and the first surface layer are alternately doped.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

The following relates to lateral DMOS transistors, such can used as a high voltage DMOS half bridge output for various DC to DC converters on a monolithic, junction isolated wafer. A high voltage high side lateral DMOS transistor is described based on the epi extension diffusion and a five layer RESURF structure. The five layers are made possible by the epi extension diffusion which is formed by a suitable n-type dopant, such as Phosphorous, diffused into a p-type substrate and it is the same polarity as the epi. In the example discussed below the five layers, starting with the substrate, are the p-type substrate, the n-type epi extension diffusion, a p-type buried layer, the n-type epi and a shallow p-type layer at the top of the epi. In an alternate set of embodiments, the layers' polarities can be switched between n-type and p-type. The epi extension diffusion is used not only for creating the five layers of alternately doped layers, it is also used to shape the electric field by a specific lateral distribution and make the lateral and vertical electric fields to be the smoother to avoid electric field induced breakdown in the silicon or in the oxide layers above the silicon.

The basic principle of operation for the DMOS transistors described here is to provide sufficient space between the p-body and the substrate for the depletion layer so that punch-through is avoided at the desired operating voltage, while keeping the n-type epi thin enough to make isolation of the low voltage devices possible with a shallow, and therefore area efficient, diffusion. An alternate path for the drain current below the p-type buried layer is also provided to lower the specific R_on of the device. The construction has similarities to those described in U.S. Pat. No. 6,573,550, which provides more detail on forming high and low voltage components on the same die. Using the p-type layers for charge compensation, the doping of the epi and epi extension diffusion can be increased significantly such that a low specific resistance can be achieved.

Figure 1:
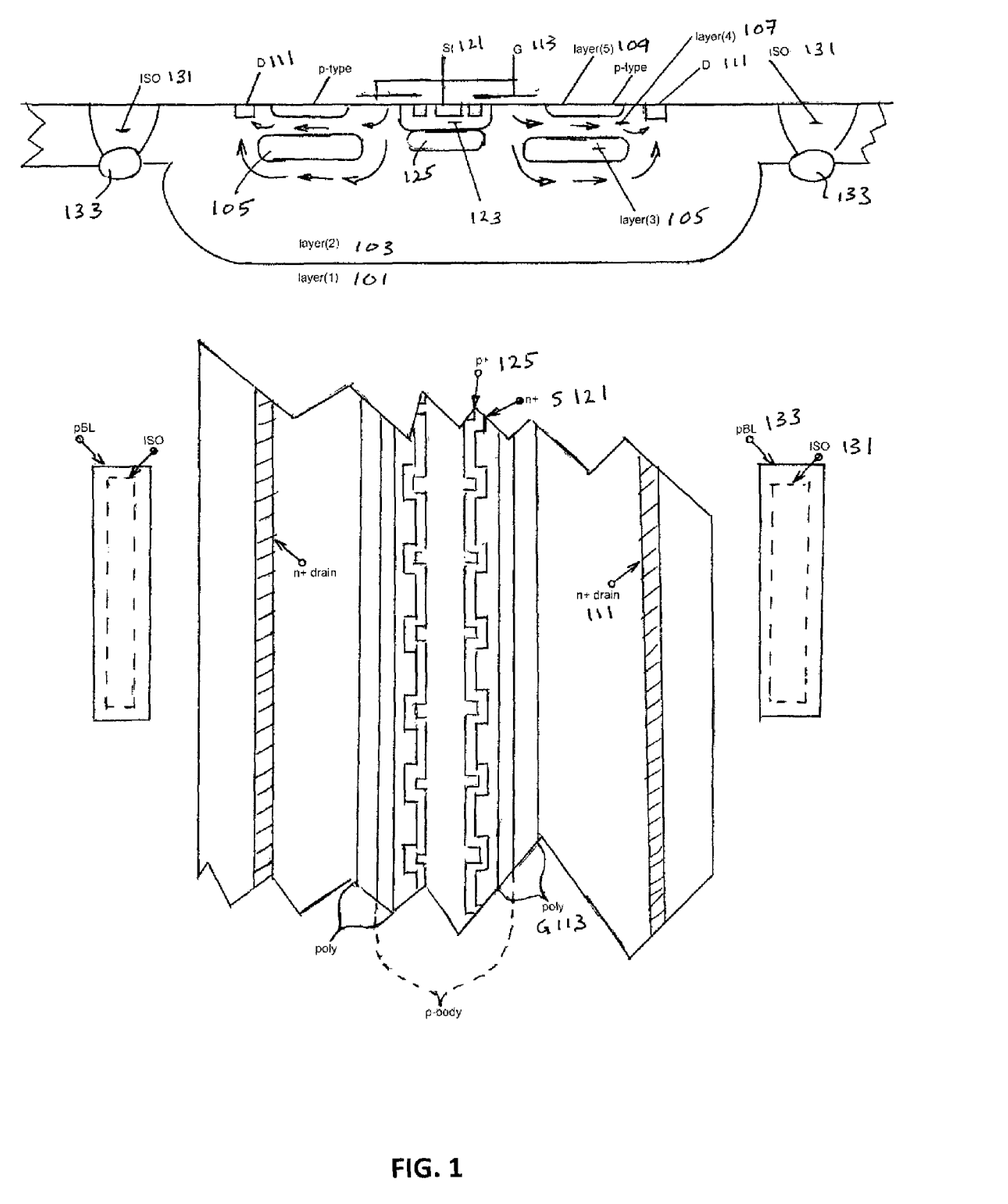
FIG. 1 is a cross-section and corresponding mask layout of a high voltage, high side DMOS with the five alternately doped layers that include an epi extension diffusion.

FIG. 1 at top is the cross-section of an example of a high voltage, high side DMOS with the five alternately doped layers that include the epi extension diffusion. The bottom part shows the mask layout of the straight part of the device, corresponding to the cross section. The arrows in the cross section illustrate the current flow through the device. The high-side device formed between left and right isolation regions ISO 131, each including a p+ type bottom isolation diffusion region. At the top of FIG. 1 is a side view cross section and at bottom is a top view. The structure in this example is left-right symmetric allowing current to flow from the source region S 121 to the left and right drain regions 111, where the left and right gate structure are represented schematically at 113. The source region 121 is formed adjacent to the p+ region 123 and within a p body region 125.

Looking at the lower part of FIG. 1, this shows a top view of the structure. To the outside are the isolation regions ISO 131, with the p+ type bottom isolation diffusion regions 133 marked pBL (poly buffered LOCOS, or local oxidation of silicon). Inside of these are the n+ drain regions D 111 over the epi extension 103. The gates G 113 are the poly regions as marked at bottom, which partially overlay the p-body 125. The zig-zag edge allows for the connection of the n+ source regions in the wider area. Between the two gates are the n+ source region S 121 and the p+ region 123.

Returning to the side-view cross-section shown at the top of FIG. 1, five layers with alternating polarity doping is created by making a deep diffusion (2) 103 into the p-type substrate layer (1) 101, followed by creating a p-type buried layer (3) 105, and then depositing epi layer (4) 107 with the appropriate thickness and doping density. A shallow p-type layer (5) 109 at the surface completes the drift region of the DMOS transistor. (In alternate embodiments, all of the layers can have their polarities switched p to n and n to p.) The usual p-body and source-drain layers then complete the DMOS layers in the silicon. To form the gate structures, a gate oxide that can be grown in the usual manner is over the p-body region and a polysilicon layer is deposited thereupon to serve as the gate of the device.

Figure 2:
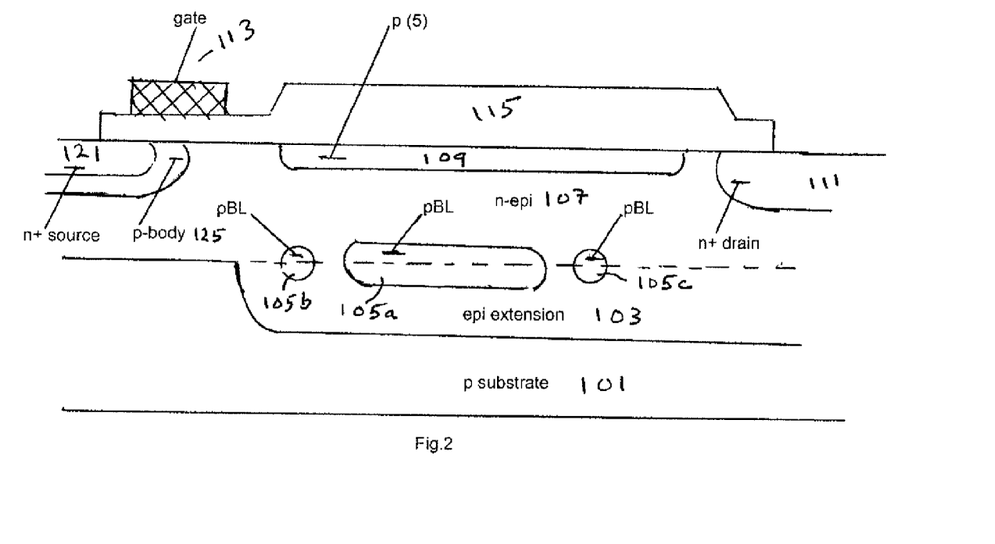
FIG. 2 is a cross-section of an advanced low side DMOS.
Figure 3:
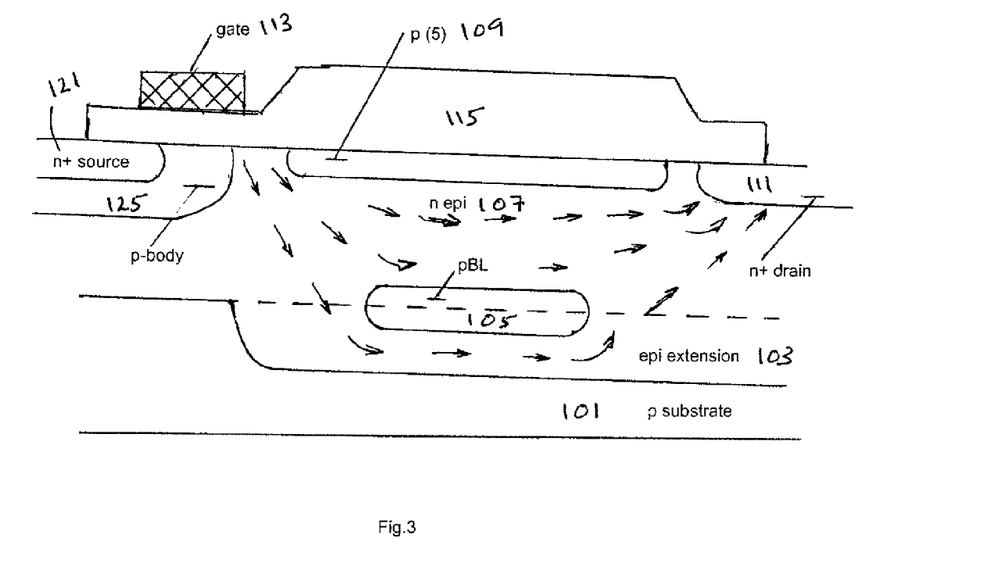
FIG. 3 shows the current flow depicted by arrows.
Figure 4:
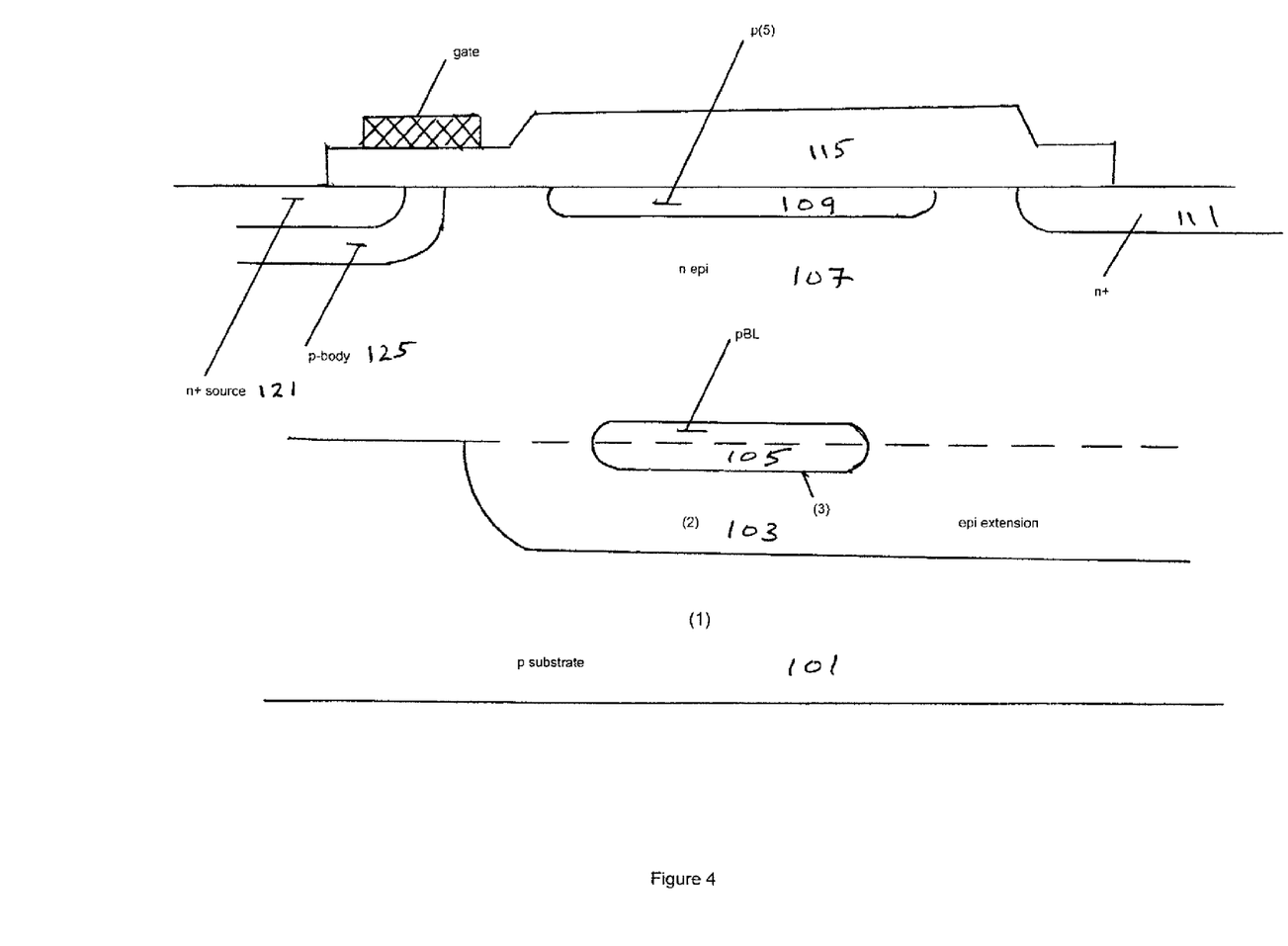
FIG. 4 shows the structure of a low side DMOS.

FIGS. 2-4 look at an example of an embodiment as a low-side device, where these figures can be taken as either the whole device or as just the right side of a two sided, left-right symmetric embodiment as for the high-side device of FIG. 1. Relative to FIG. 1, the embodiment of FIGS. 2-4 have the p substrate of layer (1) 101 closer to the p-body region 125 and do not include the p+ region 123. The gate structure is also shown in more detail to include both the gate electrode 113 and the dielectric at 115.

FIG. 3 shows the current distribution in the transistor and it can be seen from the current distribution that the specific R_on is reduced to nearly 50% compared to that of a device without the epi extension diffusion layer (2) 103 and the additional conduction path it provides. It is a feature of this arrangement that the high voltage DMOS can be made part of a low voltage BCD (Bipolar CMOS DMOS) process and be independently optimized as a high voltage device.

Figure 8:
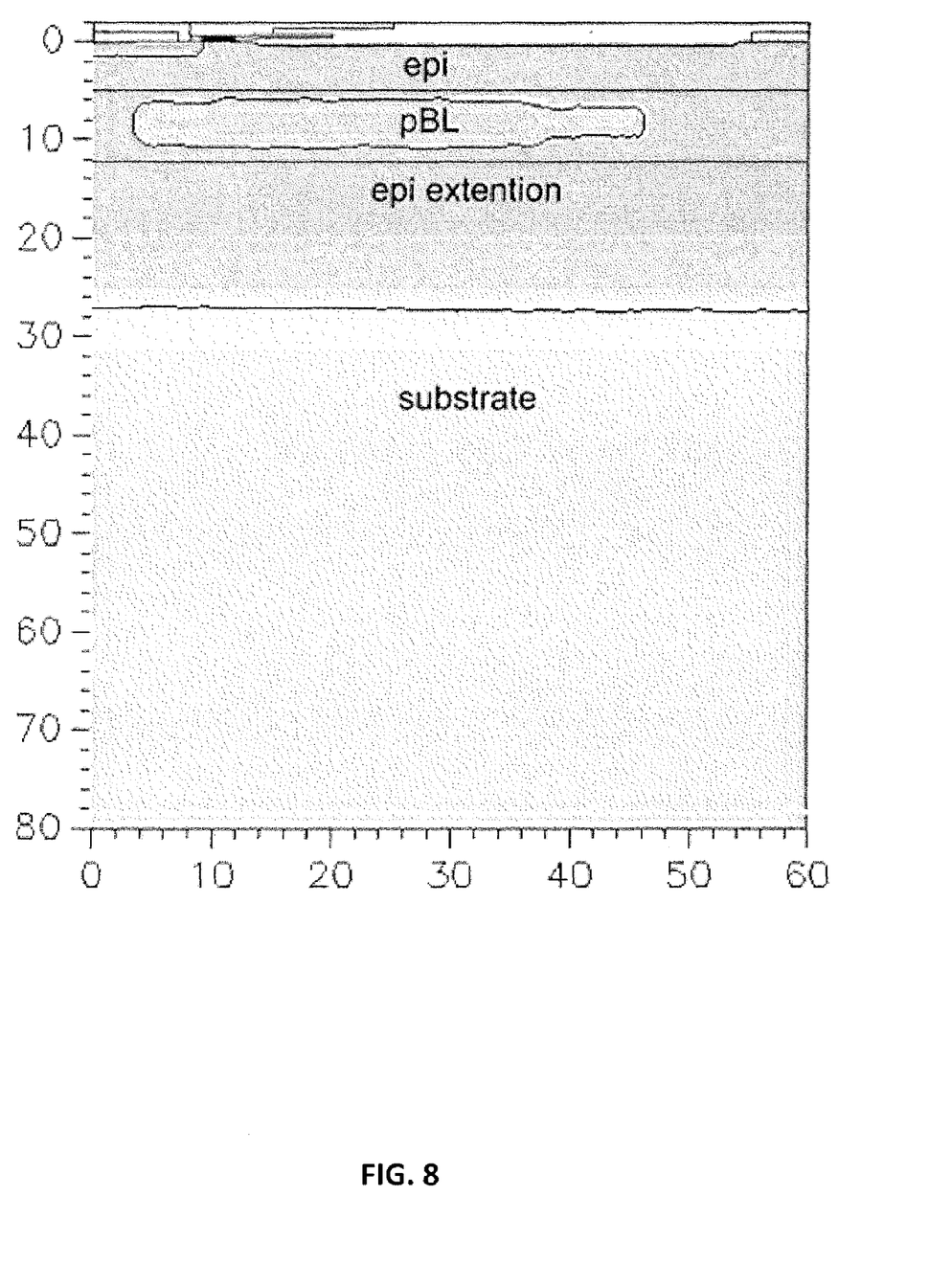
FIG. 8 shows a modified device in accordance with the principles shown on FIG. 4 for a lower specific R_on high side DMOS.

FIG. 8 shows the principle of the device operation on FIG. 3 implemented for the high side DMOS in the input file for a computer simulation. The layer thicknesses and doping concentrations can be optimized as the epi extension (layer (2) 103) junction depth and doping profile can be adjusted independently of other parameters. Layer (3) 105 parameters are somewhat limited as it is used for isolation in the low voltage section if this high voltage DMOS is part of a BCD process. However, mask averaging is still available so that layer (3) is constructed from small squares or hexagons such that the average doping is reduced anywhere from 10% to about 90%. (An example of this is described further in U.S. Pat. No. 6,573,550 with respect to its FIG. 7 and reference number 612.) The epi thickness and doping concentration is dependent on the low voltage part of the process; however, the n-well layer, used for the low voltage PMOS, is available to increase the doping concentration and layer thickness of layer (4) 107 and layer (4) can be optimized this way. Layer (5) 109 is generated by an independent implant and it can be optimized without interfering with any other part of the process.

Optimization of the electric field to obtain the maximum possible breakdown voltage for the DMOS is also possible by the method shown on FIG. 2, where layer (3) 105 has three components of 105a, 105b, and 105c. The sections 105a-c of layer (3) will have a voltage on them as determined by punch-through and governed by the spacing between the sections of layer (3). FIG. 2 shows only three sections, however, it is obvious that more sections can be created and that each section can use the mask averaging technique to further refine the characteristics of the sections and the overall doping of the layer.

The preceding has shown how to tailor layer (3) in two dimensions. Layer (3) along with layers (2) and (5) can be made up of three dimensional objects. Generating layer (3) from three dimensional objects is especially useful since layer (3) is also used in the low voltage section of the chip for isolation and that use may dictate that layer (3) use high doping density. By employing a three dimensional technique, a higher ratio for mask averaging can be achieved in both applications of layer (3), as low voltage isolation and in the high voltage DMOS, and the doping density can be independently optimized for both. The three dimensional (the x-y plane of the wafer and the z direction normal to the wafer's plane) structure comes from "dots" (at, 0.5 u×0.5 u, for example, or whatever is the minimum mask dimension) placed in a grid array with varying spacing between them. As the spacing is varied, the average doping density changes, which then changes the layer (thickness) in the z direction.

Even when a completely new process is created, the mask averaging technique can be employed to reduce the number of masking layers while enabling the designer to create an optimum three dimensional layer for pBL, epi doping and the epi extension. The device of FIG. 5 uses a simple structure for implementing a high side DMOS. The pBL is used to perform field shaping and reduce the electric field that has to terminate on the p-body of the DMOS. As the drain voltage is increased, the pBL and p-body will go into punch-through which will fix the voltage on the pBL with respect to the voltage on the p-body and the epi then has to deplete laterally towards the drain. After the pBL/p-body punch-through the depletion layer starts spreading under the pBL. The epi extension diffusion and substrate junction is developing a depletion layer as soon as the drain voltage increases from zero.

Figure 5:
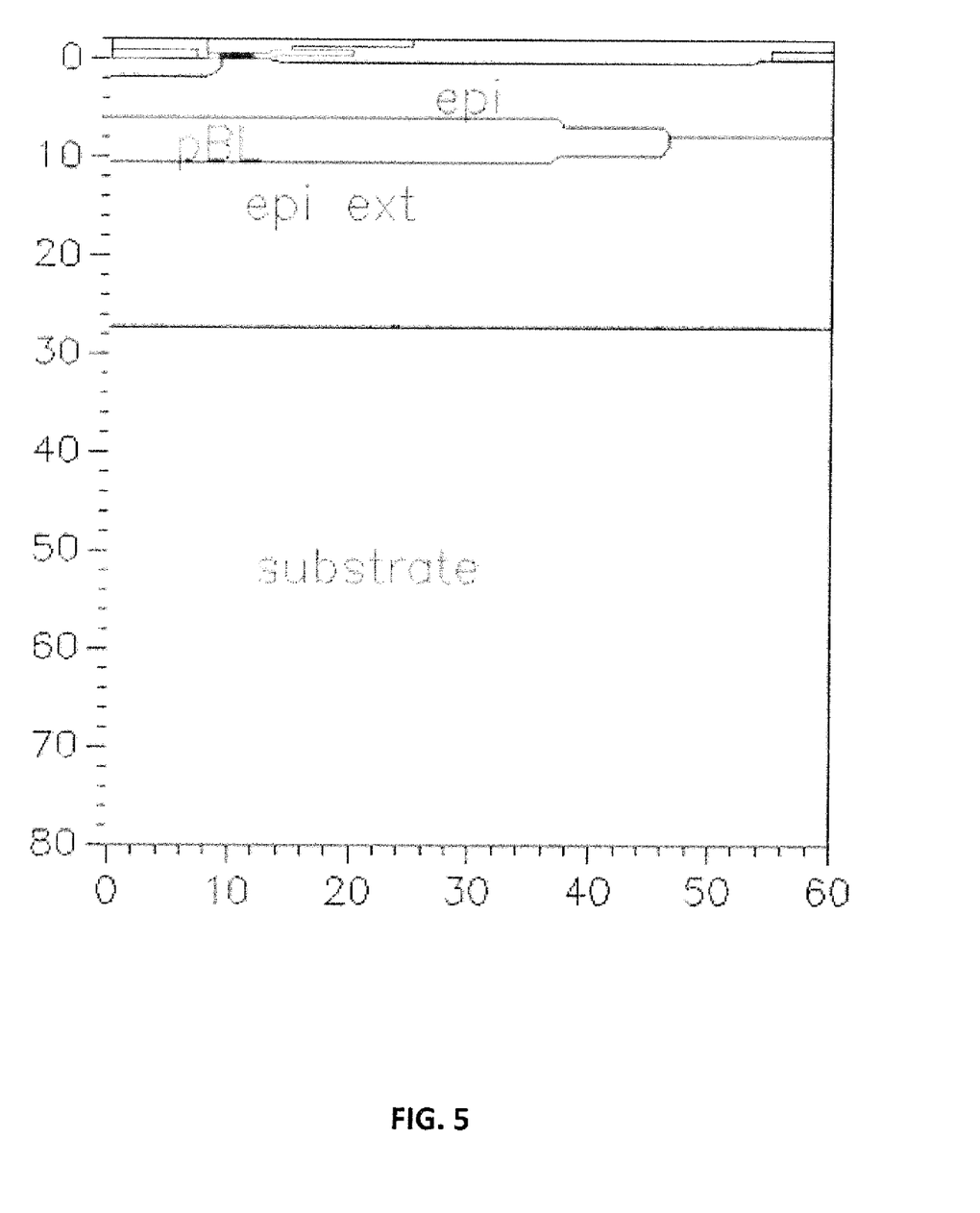
FIG. 5 shows the input file for computer simulation of an exemplary high side DMOS.

The substrate is lightly doped so most of the depletion layer spreads into it while the depletion layer on the epi extension side is much smaller. Due to the Gaussian distribution of the dopant in the epi extension, the spread of the depletion layer into the epi extension slows down with increasing voltage. The voltage on the junction between the pBL and the epi extension is lower than the voltage on the epi extension substrate junction as the pBL voltage is well above ground, where the substrate is connected. Eventually punch-through occurs between the pBL and the substrate but due to the wide depletion layer and reduced voltage between them the punch-through current remains very low. When the transistor is turned on, the source voltage is practically the same as the drain voltage and basically all the depletion layer is between the substrate and the epi extension. Under these conditions the pBL is isolated from both the p-body and the substrate by the un-depleted part of the epi and epi extension. As this condition is approached, the pBL voltage will be the same as the drain voltage.

Figure 6:
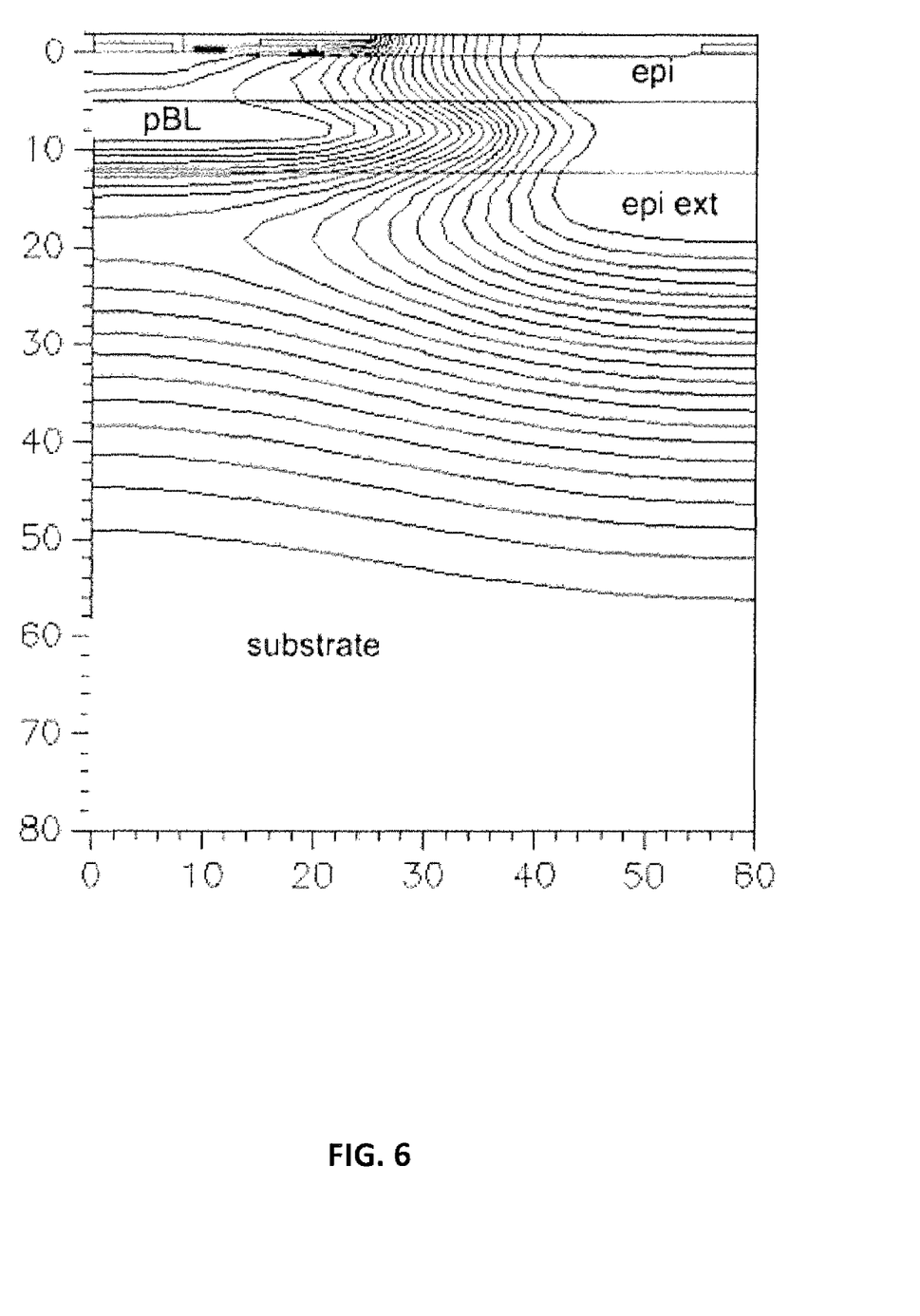
FIG. 6 shows the simulation result of the device of FIG. 5 with a source-drain bias of 450V.
Figure 7:
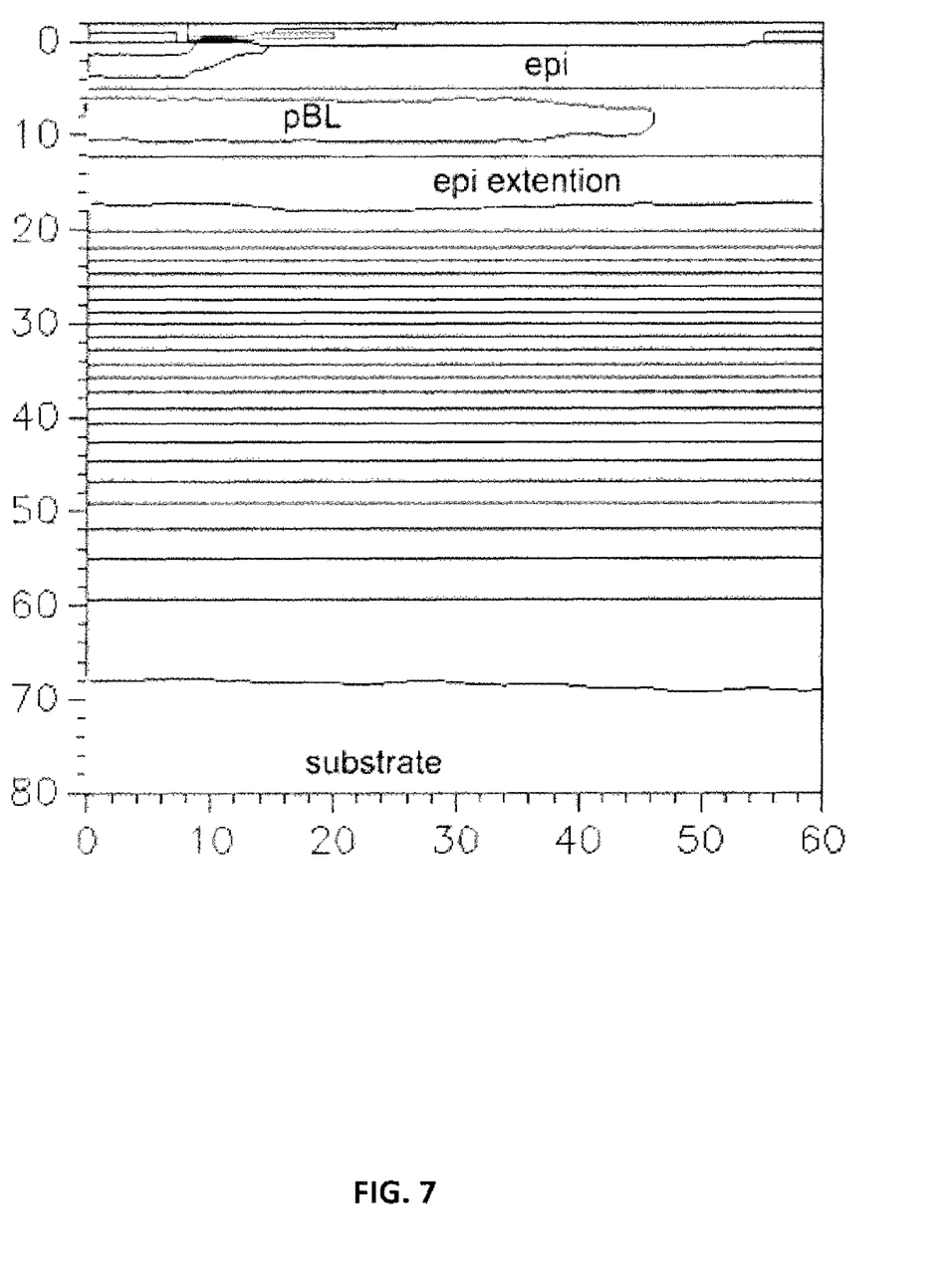
FIG. 7 is the computer simulation output of the device.

FIG. 6 shows the simulation result of the device of FIG. 5 with a source-drain bias of 450V and FIG. 7 is the output for the condition when the drain voltage is 450V and source and gate voltage are 440V. The equipotential contour lines at spaced at 20V. The simulation results are consistent with the theoretical analysis of the on-state condition of the transistor and that the high side operation of the transistor is consistent with the circuit application in a half bridge output configuration or a single high side transistor application.

Figure 9:
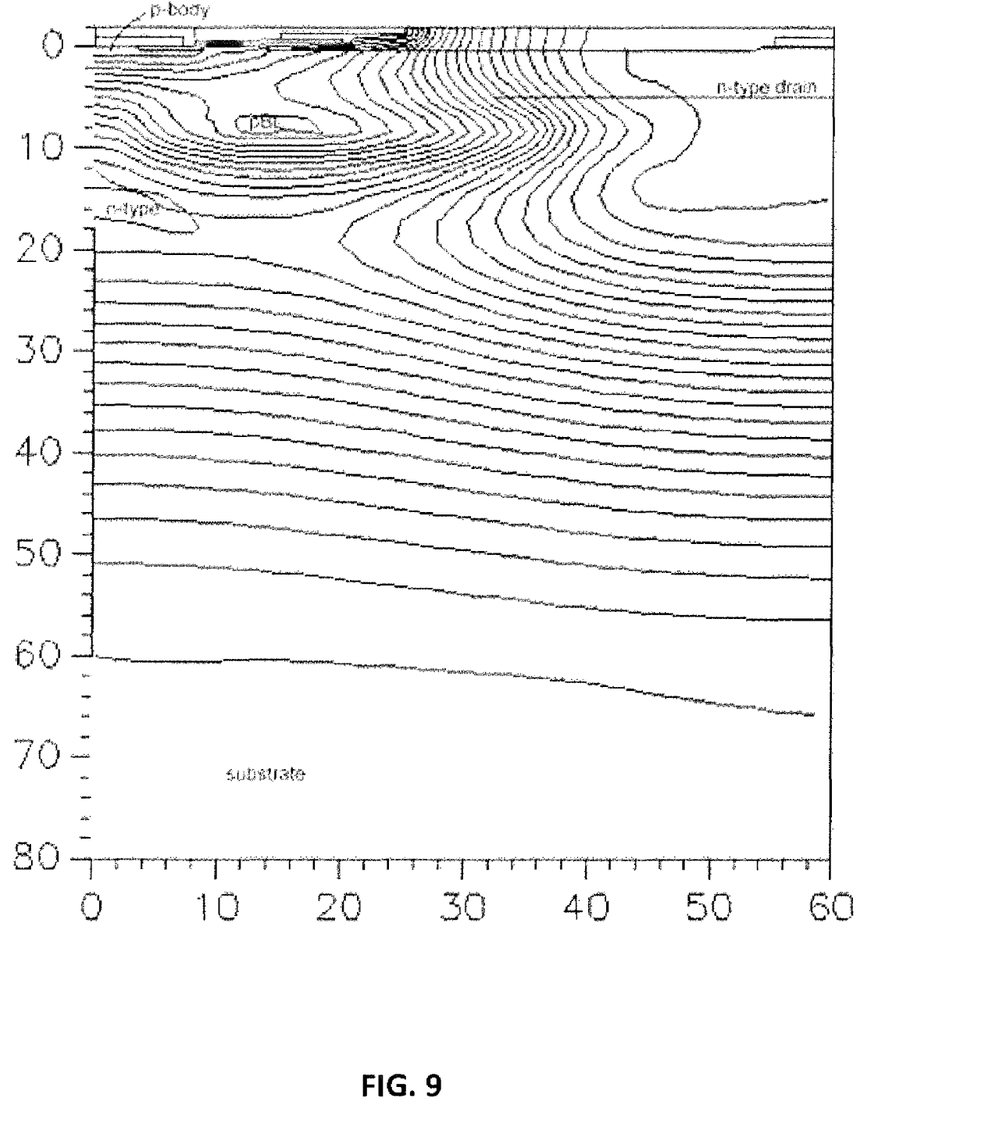
FIG. 9 shows the device of FIG. 8 is shown with a high voltage drain bias of 450V. This condition occurs when the high side device is tuned off and the half-bridge output is in the "low" state.
Figure 10:
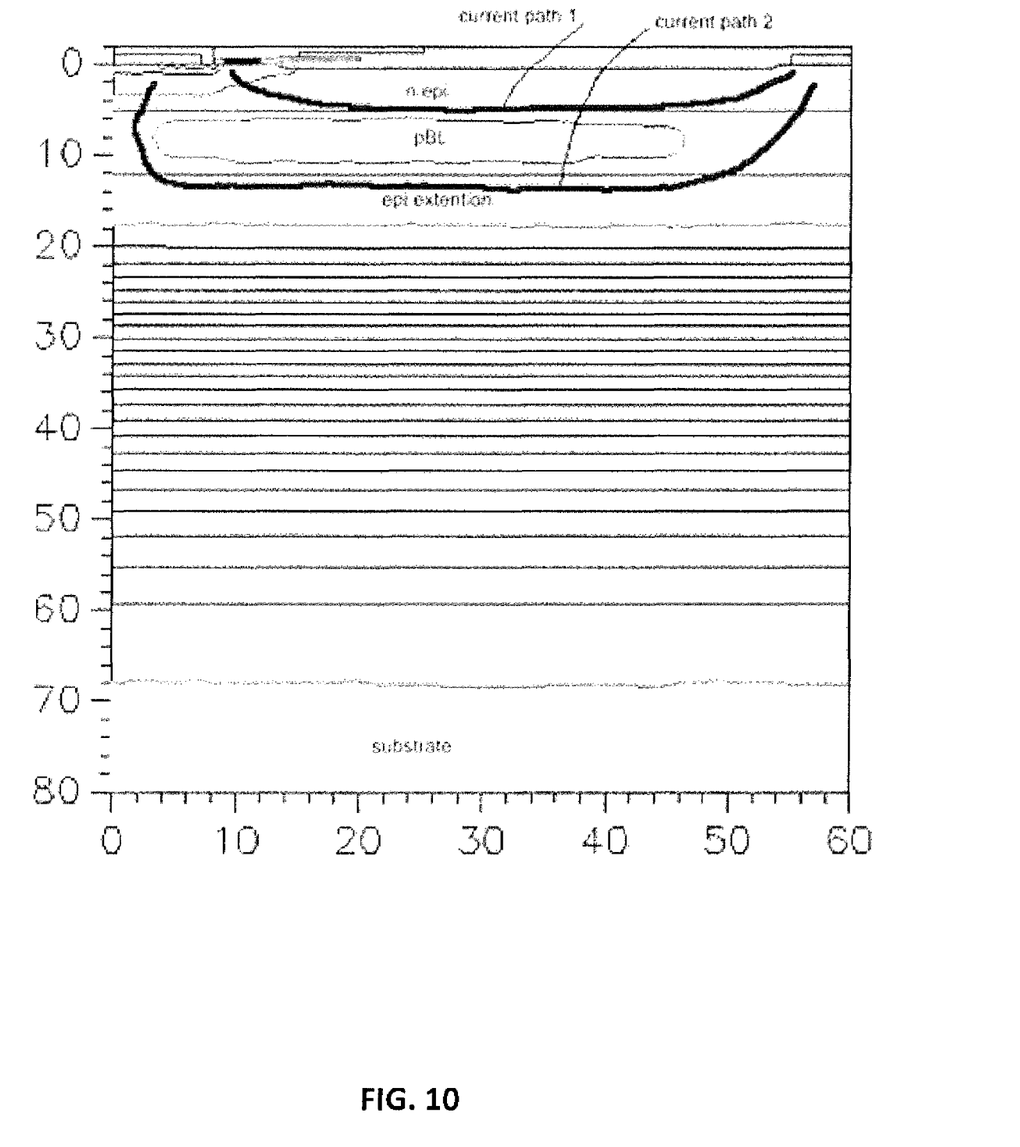
FIG. 10 shows the device of FIG. 8 with the drain bias at 450V and the source at 440V. This is the condition when the half-bridge output is in the "high" state.

FIG. 4 shows the structure of a low side DMOS that can be built with the same process as the high side DMOS of FIG. 1 so a half-bridge output can be constructed on a single, monolithic, junction isolated chip. A modified device in accordance with the principles shown on FIG. 4 is depicted on FIG. 8. The drain current has two paths to go, one above the pBL and one below it. FIG. 9 shows the device of FIG. 8 with a high voltage drain bias of 450V. FIG. 10 shows the device of FIG. 8 with the drain bias at 450V and the source at 440V. The two current paths from the drain to source are the n-type epi extension region under the pBL and the n-type epi above the pBL. This device is not only capable of working at 450V but it also provides a lower specific R_on than standard low side DMOS.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A lateral DMOS transistor, comprising:
   a substrate;
   first and second isolation regions formed above the substrate;
   a source region formed above the substrate between the first and second isolation regions;
   a first drain region formed above the substrate between the first isolation region and the source region;
   a first gate structure, formed over the substrate between the source region and the first drain region and adjacent to the source region;
   a first epitaxy layer formed over the substrate between the isolation regions;
   a first buried layer formed above the first epitaxy layer and extending laterally between, but not under, the source region and the first drain region;
   a second epitaxy layer formed over the first epitaxy layer and the first buried layer between the isolation regions; and
   a first surface layer formed over the second epitaxy layer between the first gate structure and the first drain region,
   wherein the substrate, first epitaxy layer, first buried layer, second epitaxy layer, and the first surface layer are alternately doped.

2. The lateral DMOS transistor of claim 1, further comprising:
   a second drain region formed above the substrate between the second isolation region and the source region;
   a second gate structure, formed over the substrate between the source region and the second drain region and adjacent to the source region;
   a second buried layer formed above the first epitaxy layer and under the second epitaxy layer and extending laterally between, but not under, the source region and the second drain region; and
   a second surface layer formed over the second epitaxy layer between the second gate structure and the second drain region,
   wherein the second buried layer and the second surface layer are respectively doped the same as the first buried layer and the first surface layer.

3. The lateral DMOS transistor of claim 2, wherein the lateral DMOS transistor is a high side device.

4. The lateral DMOS transistor of claim 1, further comprising:
   a first p-body region within which the source region is formed.

5. The lateral DMOS transistor of claim 4, further comprising:
   a second p-body region formed between the first p-body region and the second epitaxy region.

6. The lateral DMOS transistor of claim 1, wherein the substrate, the first buried layer, and the first surface layer are of an n-type doping, and the first and second epitaxy layers are of a p-type doping.

7. The lateral DMOS transistor of claim 1, wherein the substrate, the first buried layer, and the first surface layer are of a p-type doping, and the first and second epitaxy layers are of an n-type doping.

8. The lateral DMOS transistor of claim 1, wherein the first gate structure partially overlaps the source region.

9. The lateral DMOS transistor of claim 1, wherein the first gate structure partially overlaps the first buried layer.

10. The lateral DMOS transistor of claim 1, wherein the first buried layer is formed a plurality of disjoint sections.

11. The lateral DMOS transistor of claim 1, wherein the lateral DMOS transistor is a low side device.

\* \* \* \* \*